United States Patent
Sim et al.

(10) Patent No.: US 10,116,280 B2
(45) Date of Patent: Oct. 30, 2018

(54) COIL COMPONENT

(71) Applicant: SAMSUNG ELECTRO-MECHANICS CO., LTD., Suwon-si, Gyeonggi-do (KR)

(72) Inventors: Won Chul Sim, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 83 days.

(21) Appl. No.: 15/093,376

(22) Filed: Apr. 7, 2016

(65) Prior Publication Data
US 2017/0026019 A1    Jan. 26, 2017

(30) Foreign Application Priority Data
Jul. 20, 2015 (KR) .......... 10-2015-0102320

(51) Int. Cl.
*H03H 7/42* (2006.01)

(52) U.S. Cl.
CPC ......... *H03H 7/427* (2013.01); *H03H 2250/00* (2013.01)

(58) Field of Classification Search
CPC ....... H03H 7/427; H03H 2250/00; H04B 1/10
USPC ................... 333/202; 455/306, 307
See application file for complete search history.

(56) References Cited

U.S. PATENT DOCUMENTS

| 6,998,939 B2 | 2/2006 | Nakayama et al. |
| 2003/0134612 A1 | 7/2003 | Nakayama et al. |
| 2017/0316869 A1* | 11/2017 | Omori ................. H01F 27/2804 |

FOREIGN PATENT DOCUMENTS

| CN | 1425183 A | 6/2003 |
| CN | 107155366 A | 9/2017 |
| JP | 2007-129291 A | 5/2007 |
| JP | 2009-302580 A | 12/2009 |
| JP | 2012-195332 A | 10/2012 |

(Continued)

OTHER PUBLICATIONS

Korean Office Action dated Jul. 18, 2016, issued in Korean patent application No. 10-2015-0102320. (w/ English translation).

(Continued)

*Primary Examiner* — Benny Lee
*Assistant Examiner* — Hafizur Rahman
(74) *Attorney, Agent, or Firm* — McDermott Will & Emery LLP

(57) ABSTRACT

A coil component includes a magnetic body having a plurality of filter parts disposed on a substrate and spaced apart from each other in a thickness direction. A plurality of input terminals and output terminals are disposed on outer surfaces of the magnetic body. Each of the filter parts includes upper and lower coils disposed in the magnetic body and spaced apart from each other in the thickness direction. In one example, a number of turns of the upper and lower coils of one filter part is different from a number of turns of the upper and lower coils of another filter part adjacent thereto. In another example, the number of turns of the upper and lower coils of the one and the other filter parts are the same, but capacitances of the one and the other filter parts are different.

16 Claims, 5 Drawing Sheets

(56) References Cited

FOREIGN PATENT DOCUMENTS

| JP | 2012-248917 A | 12/2012 |
|----|---------------|---------|
| JP | 2014-212189 A | 11/2014 |
| KR | 10-2005-0011090 A | 1/2005 |
| KR | 10-2012-0033644 A | 4/2012 |
| WO | 2016079903 A1 | 5/2016 |

OTHER PUBLICATIONS

First Office Action issued in Chinese Patent Application No. 201610286274.0 dated Oct. 11, 2017 (with English translation).
Second Office Action issued in Chinese Patent Application No. 201610286274.0, dated Aug. 20, 2018 (English translation).

\* cited by examiner

X-X'

Y-Y`

COIL COMPONENT

CROSS-REFERENCE TO RELATED APPLICATION

This application claims the priority and benefit of Korean Patent Application No. 10-2015-0102320 filed on Jul. 20, 2015 with the Korean Intellectual Property Office, the disclosure of which is incorporated herein by reference.

BACKGROUND

The present disclosure relates to a coil component capable of attenuating common mode noise in a plurality of frequency bands, and a board having the same.

In accordance with the recent demand for thinness, lightness, and improvement of performance, electronic devices have been required to perform various functions and have a significantly decreased size.

In these electronic devices, a common mode filter (CMF) may be provided to remove common mode noise. For example, in a liquid crystal display (LCD) connector configured to receive a high-speed signal according to a differential transmission scheme, a common mode filter (CMF) may be used for removing common mode noise.

In addition, a multilayer ceramic capacitor (MLCC) can be used for DC blocking. Such a capacitor may be connected in series with the common mode filter (CMF) as a filter for differential transmission.

A common mode filter (CMF) according to the related art has two coils that are magnetically coupled to each other by a magnetic body disposed on and below the two coils to form a closed magnetic circuit.

Generally, in the common mode filter (CMF), two vertically stacked filter parts are connected to each other in series, and a shield electrode is formed between the filters in order to prevent magnetic coupling between the filters.

However, in a case in which an area of the shield electrode in the structure is small, it may be difficult to prevent magnetic flux coupling between the filters. Further, in a case in which the area of the shield electrode is large, the shield electrode may hinder magnetic flux between the filters, thereby decreasing inductance.

A need thus exists for a common mode filter (CMF) capable of solving the above-mentioned problems and removing noise in a plurality of frequency bands.

SUMMARY

An aspect of the present disclosure provides a coil component capable of attenuating common mode noise in a plurality of frequency bands.

According to an aspect of the present disclosure, a coil component may include a magnetic body including a plurality of filter parts disposed on a substrate and spaced apart from each other in a thickness direction. A plurality of input terminals and output terminals are disposed on outer surfaces of the magnetic body. Each of the filter parts includes upper and lower coils disposed in the magnetic body and spaced apart from each other in the thickness direction, and a number of turns of the upper and lower coils of one filter part is different from a number of turns of the upper and lower coils of another filter part adjacent thereto.

According to another aspect of the present disclosure, a coil component may include a magnetic body including a plurality of filter parts disposed on a substrate and spaced apart from each other in a thickness direction. A plurality of input terminals and output terminals are disposed on outer surfaces of the magnetic body. Each of the filter parts includes upper and lower coils disposed in the magnetic body and spaced apart from each other in the thickness direction, a number of turns of upper and lower coils of one filter part is the same as a number of turns of upper and lower coils of another filter part adjacent thereto, and capacitance of the one filter part is different from capacitance of the other filter part adjacent thereto.

According to a further aspect of the present disclosure, a coil component includes a magnetic body having first and second filter parts overlaying each other and a main surface of a substrate, and spaced apart from each other in a thickness direction orthogonal to the main surface of the substrate. Each of the first and second filter parts includes upper and lower coils disposed in the magnetic body to overlay each other and spaced apart from each other in the thickness direction. One of the upper and lower coils of the first filter part is electrically connected in series with one of the upper and lower coils of the second filter part. Additionally, another of the upper and lower coils of the first filter part is electrically connected in series with another of the upper and lower coils of the second filter part.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
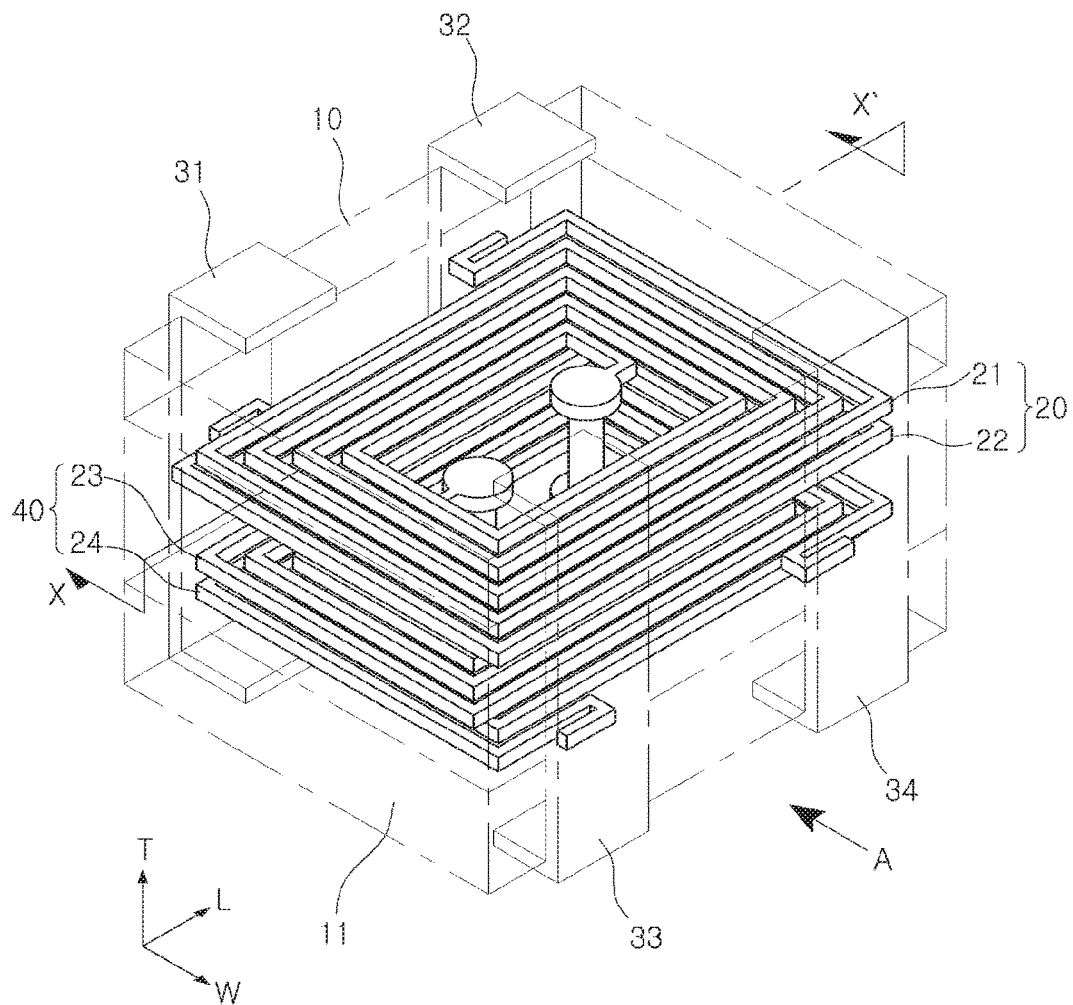
FIG. 1 is a projected perspective view illustrating an interior of a coil component according to an exemplary embodiment.

Hereinafter, embodiments of the present inventive concepts will be described as follows with reference to the attached drawings.

The present inventive concepts may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region, or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another member, component, region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's positional relationship relative to other element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concepts will be described with reference to schematic views illustrating embodiments of the present inventive concept. In the drawings, components having ideal shapes are shown. However, variations from these shapes, for example due to variability in manufacturing techniques and/or tolerances, also fall within the scope of the disclosure. Thus, embodiments of the present inventive concept should not be construed as being limited to the particular shapes of regions shown herein, but should more generally be understood to include changes in shapes resulting from manufacturing methods and processes. The following embodiments may also be constituted by one or a combination thereof.

The present inventive concepts described below may be implemented in a variety of configurations, and the description below describes only some illustrative configurations. However, one of skill in the art will understand that the inventive concepts are not limited to the particular configurations shown herein, but extend to other configurations as well.

Coil Component

FIG. 1 is a projected perspective view illustrating an interior of a coil component according to an exemplary embodiment.

Figure 2:
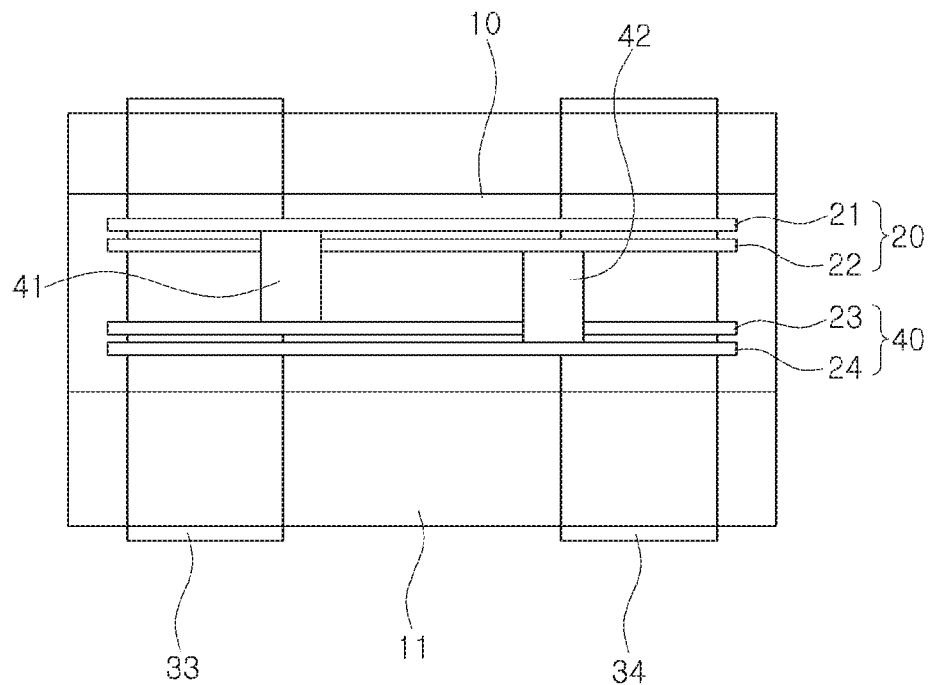
FIG. 2 is a projected plan view illustrating the interior of the coil component in a direction A of FIG. 1.

FIG. 2 is a projected plan view illustrating the interior of the coil component in a direction A of FIG. 1.

Referring to FIGS. 1 and 2, according to the exemplary embodiment, a coil component may include a magnetic body 10 including a plurality of filter parts 20 and 40 disposed on a substrate 11. The filter parts 20 and 40 are disposed on the substrate 11 so as to be spaced apart from each other in a thickness direction (e.g., such that they overlay each other, and are stacked substantially parallel to each other). A plurality of input terminals 31 and 32 and output terminals 33 and 34 are disposed on outer surfaces of the magnetic body 10. Additionally, the filter part 20 may be composed of upper and lower coils 21 and 22 disposed in the magnetic body 10 and spaced apart from each other in the thickness direction, the filter part 40 may be composed of upper and lower coils 23 and 24 disposed in the magnetic body 10 and stacked relative to each other in the thickness direction, and the number of turns of the coils 21 and 22 of one filter part 20 is different from the number of turns of the coils 23 and 24 of another filter part 40 adjacent thereto.

As used herein, the terms "first" to "fourth" are used in order to distinguish the objects, and are not limited to the order.

The magnetic body 10 may be a hexahedron, and an "L direction" may refer to a "length direction", a "W direction" may refer to a "width direction", and a "T direction" may refer to a "thickness direction".

The magnetic body 10 may include the substrate 11 and the plurality of filter parts 20 and 40 disposed on the substrate 11 so as to be spaced part from each other in the magnetic body in the thickness direction.

As shown in FIGS. 1 and 2, the plurality of filter parts can include two filter parts 20 and 40, which may be first and second filter parts, that are disposed as illustrated in FIGS. 1 and 2. However, more generally, the plurality of filter parts may include different numbers or arrangements of filter parts.

The coil component according to the exemplary embodiment may include first and second external electrodes 31 and 32, which are the input terminals formed on one surface of the magnetic body 10, and third and fourth external electrodes 33 and 34, which are the output terminals formed on another surface of the magnetic body 10 opposite to the one surface thereof.

Hereinafter, two coils 21 and 22 provided in the first filter part 20 and two coils 23 and 24 provided in the second filter part 40 (hereinafter referred to as "first to fourth coils," respectively) will be described with reference to FIGS. 1 and 2. Additionally, the first to fourth external electrodes 31 to 34, which are the input and output terminals, will be described with reference to FIGS. 1 and 2.

The first and second coils 21 and 22 may constitute the first filter part 20 as one set, and the third and fourth coils 23 and 24 may constitute the second filter part 40 as another set.

The second filter part 40 composed of the third and fourth coils 23 and 24 may be disposed on the substrate 11, and the first filter part 20 composed of the first and second coils 21 and 22 may be disposed to be spaced apart from the second filter part 40 in the magnetic body 10 in the thickness direction.

That is, the first filter part 20 may be composed of the first and second coils 21 and 22, which respectively are upper and lower coils disposed in the magnetic body 10 and spaced apart from each other in the thickness direction. The second filter part 40 may be composed of the third and fourth coils 23 and 24, which respectively are upper and lower coils that are both disposed to be spaced apart from the first filter part 20.

In this case, the first and second coils 21 and 22 constituting the first filter part 20 may have the same (or almost the same) number of turns as each other, and the third and fourth coils 23 and 24 constituting the second filter part 40 may also have the same (or almost the same) number of turns as each other.

As described above, a coil component composed of the plurality of filter parts 20 and 40 and being capable of attenuating common mode noise in a plurality of frequency regions, particularly a common mode filter, may have a structure in which the plurality of filter parts 20 and 40 are connected to each other in series, and stacked in the magnetic body in the thickness direction (e.g., in a direction orthogonal to a main surface of the substrate 11 on which the second filter part 40 is disposed).

Therefore, the plurality of filter parts 20 and 40 may have regions overlapping each other on a vertically protected region. For example, the filter parts 20 and 40 may have regions vertically overlapping each other (where a vertical direction coincides with a thickness direction orthogonal to a main surface of the substrate 11 on which the second filter part 40 is disposed).

According to the exemplary embodiment, the coil component may have a structure in which the number of turns of the coils 21 and 22 in one filter part 20 is different from that of the coils 23 and 24 of another filter part 40 adjacent thereto.

That is, the number of turns of the first and second coils 21 and 22 constituting the first filter part 20 may be different from that of the third and fourth coils 23 and 24 constituting the second filter part 40.

The coils 21 and 22 constituting the first filter part 20 and the coils 23 and 24 constituting the second filter part 40 may be formed to have different numbers of turns as described above, and thus inductance and parasitic capacitance of each of the filter parts may be different from each other.

Each of the first and second filter parts 20 and 40 may be adjusted to have different inductance and parasitic capacitance as described above, and thus a resonance frequency of each of the filter parts may be adjusted, and common mode noise in the plurality of frequency bands may be attenuated.

That is, in a case in which inductance and parasitic capacitance of the first filter part 20 is different from inductance and parasitic capacitance of the second filter part 40, a frequency band in which the common mode noise is attenuated may be widened.

According to the exemplary embodiment, the first and second filter parts 20 and 40 may have different inductances and parasitic capacitances from each other by forming the coils constituting the first filter part 20 and the coils constituting the second filter part 40 to have different numbers of turns, and thus the first and second filter parts 20 and 40 may have different resonance frequencies from each other, but are not limited thereto.

That is, the resonance frequencies of the plurality of filter parts (e.g., 20, 40) may be different from each other by allowing at least one of inductance and capacitance of each of the plurality of filter parts to be different from each other.

The first to fourth coils 21 to 24 may each be exposed to one surface or another surface of the magnetic body 10 at locations that are spaced apart from each other.

The first to fourth coils 21 to 24 are each exposed to one surface or another surface of the magnetic body 10 at locations spaced apart from each other. For example, as shown in FIG. 1, the first to fourth coils 21 to 24 may each contact or be connected to a respective one of the first to fourth external electrodes 31 to 34.

More specifically, the first coil 21 may be exposed to a first surface of the magnetic body 10 to thereby contact and be connected to the first external electrode 31.

In addition, the second coil 22 may be exposed to the first surface of the magnetic body 10 to thereby contact and be connected to the second external electrode 32.

Further, the third coil 23 may be exposed to a second surface of the magnetic body 10 to thereby contact and be connected to the third external electrode 33.

The fourth coil 24 may be exposed to the second surface of the magnetic body 10 to thereby contact and be connected to the fourth external electrode 34.

The first and second external electrodes 31 and 32 may be the input terminals, and the third and fourth external electrodes 33 and 34 may be the output terminals, but the first to fourth external electrodes 31 to 34 are not limited thereto.

Meanwhile, the first and third coils 21 and 23 may be connected to each other (e.g., in series) through a via 41.

Similarly, the second and fourth coils 22 and 24 may also be connected to each other (e.g., in series) through a via 42.

Therefore, a current may flow from the first external electrode 31, which is an input terminal, to the third external electrode 33, which is an output terminal, while passing through the first coil 21, the via 41, and the third coil 23.

Similarly, the current may flow from the second external electrode 32, which is an input terminal, to the fourth external electrode 34, which is an output terminal, while passing through the second coil 22, the via 42, and the fourth coil 24.

The first to fourth coils 21 to 24 may contain at least one selected from the group consisting of gold, silver, platinum, copper, nickel, palladium, and alloys thereof.

In some examples, the first to fourth coils 21 to 24 can be formed of any material as long as the material may impart conductivity to the coils. In such examples, the material of the first to fourth coils 21 to 24 is not limited to the above-mentioned metals.

Further, the first to fourth coils 21 to 24 may have a polygonal shape (e.g., a rectangular shape, as shown in FIG. 1), a circular shape, an oval shape, or an irregular shape, but the shape is not particularly limited. Further, the first to fourth coils 21 to 24 may each have substantially the same shape as each other.

The first to fourth coils 21 to 24 may each be connected to a respective one of the first to fourth external electrodes 31 to 34 through lead terminals (not illustrated).

The first to fourth external electrodes 31 to 34 may be extended in the thickness direction ("T direction") of the magnetic body 10. For example, the first to fourth external electrodes 31 to 34 may extend along the entire thickness of the magnetic body 10, as shown in FIG. 1.

The first to fourth external electrodes 31 to 34 may be disposed to be spaced apart from each other, thereby being electrically separated and insulated from each other.

The first to fourth external electrodes 31 to 34 may be extended to portions of upper and lower surfaces of the magnetic body 10.

In embodiments in which the first to fourth external electrodes 31 to 34 extend to upper and lower surfaces of the magnetic body 10, adhesive force between the first to fourth external electrodes 31 to 34 and the magnetic body 10 may be improved since bonding portions between the first to fourth external electrodes 31 to 34 and the magnetic body 10 have an angular shape. In such embodiments, and the coil component may exhibit improved performance in enduring external impact, or the like.

A metal used in the first to fourth external electrodes 31 to 34 is not particularly limited as long as the metal imparts electrical conductivity to the first to fourth external electrodes 31 to 34.

More specifically, the first to fourth external electrodes 31 to 34 may contain at least one or more selected from the group consisting of gold, silver, platinum, copper, nickel, palladium, and alloys thereof.

Gold, silver, platinum, and palladium are expensive but have an advantage in that they are stable, and copper and nickel are cheap but have a disadvantage in that they may be oxidized during the sintering to thereby decrease electrical conductivity.

A thickness of the magnetic body 10 of the coil component according to the exemplary embodiment may be 1.2 mm or less, but is not limited thereto. The magnetic body 10 may be manufactured to have various thicknesses.

The substrate 11 may be a magnetic substrate, and a magnetic material of the substrate 11 may contain nickel-zinc-copper ferrite.

Figure 3:
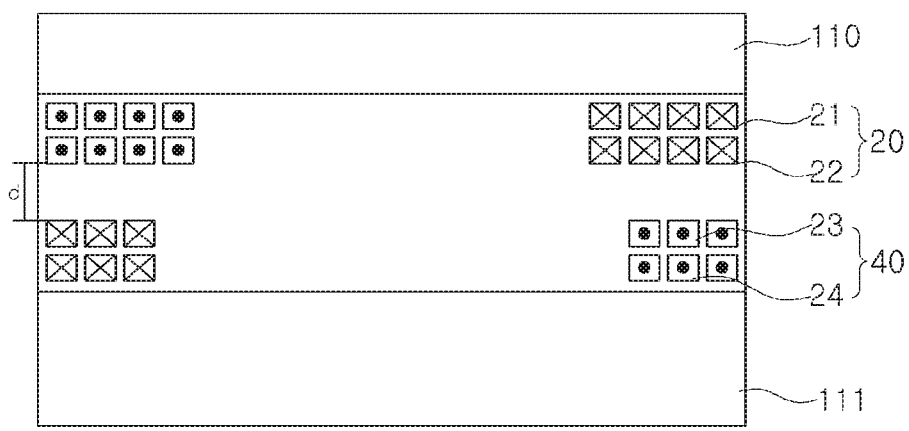
FIG. 3 is a cross-sectional view of a coil component according to a first exemplary embodiment, taken along line X-X' of FIG. 1.

FIG. 3 is a cross-sectional view of a coil component according to a first exemplary embodiment taken along line X-X' of FIG. 1.

Referring to FIG. 3, a direction of the current flowing in the coils 21 and 22 of one filter part 20 may be opposite to a direction of the current flowing in the coils 23 and 24 of another filter part 40 adjacent thereto.

That is, when the direction of the current flowing in the coils 21 and 22 of one filter part 20 and the direction of the current flowing the coils 23 and 24 of another filter part 40 adjacent thereto are opposite to each other, directions of magnetic fluxes generated from the coils may become opposite to each other, and thus magnetic coupling may not be generated between two filters.

Even though there is no magnetic flux coupling prevention structure, the resonance frequencies may be separated from each other by adjusting the directions of the currents in the coils to be opposite to each other as described above, and insertion loss characteristics and attenuation characteristics in two different frequency regions may be obtained.

The direction of the current flowing in the coils 21 and 22 of the first filter part 20 may be opposite to the direction of the current flowing in the coils 23 and 24 of the second filter part 40 as described above by allowing a winding direction of the coils 21 and 22 of the first filter part 20 and a winding direction of the coils 23 and 24 of the second filter part 40 to be opposite to each other.

According to the exemplary embodiment, the plurality of filter parts 20 and 40 may be connected to each other in series.

According to the exemplary embodiment, a distance d between the filter parts 20 and 40 may be 10 μm to 200 μm.

An attenuation amount may be increased and distortion of the resonance frequency to be attenuated may be decreased by adjusting the distance d between the filter parts 20 and 40 to be 10 μm to 200 μm.

The reason that the attenuation amount is increased and distortion of the resonance frequency to be attenuated is decreased as described above is that as the distance d between the first and second filter parts 20 and 40 is increased, an offset effect between the magnetic fluxes generated in directions opposite to each other is decreased.

In a case in which the distance d between the filter parts 20 and 40 is less than 10 μm, the attenuation amount may be decreased, and distortion of the resonance frequency may also be increased.

In a case in which the distance d between the filter parts 20 and 40 is more than 200 μm, the attenuation amount of the second filter part 40 may be decreased, and distortion of the resonance frequency may also be increased.

The reason is as follows. As the attenuation effect is lost due to an increase in the distance d between the first and second filter parts 20 and 40, a magnetic flux of the first filter part 20 is excessively strong, and thus the attenuation amount of the first filter part 20 may be increased, but the magnetic flux may have an influence on formation of the magnetic flux of the second filter part 40, thereby decreasing the attenuation amount and increasing distortion of the resonance frequency.

Figure 4:
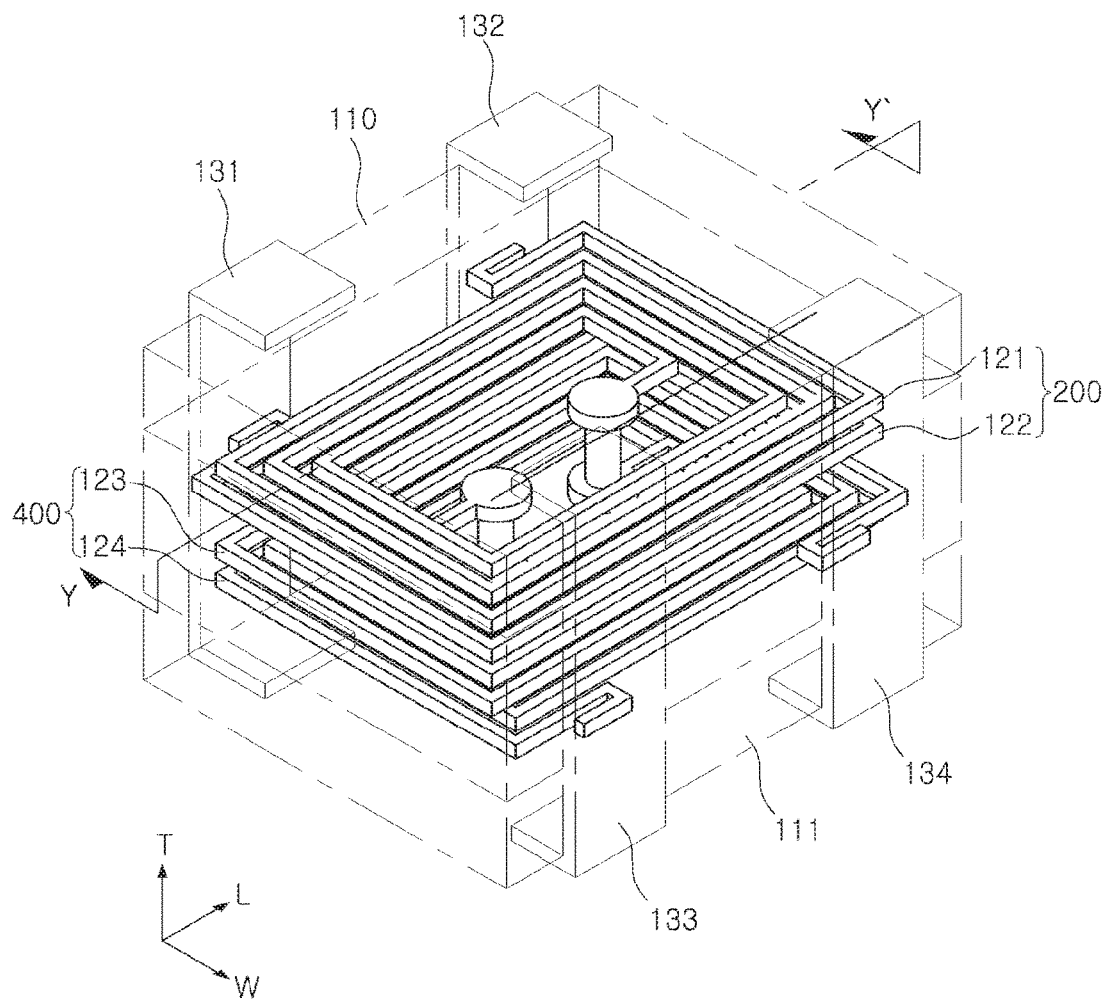
FIG. 4 is a projected perspective view illustrating an interior of a coil component according to another exemplary embodiment.

FIG. 4 is a projected perspective view illustrating an interior of a coil component according to another exemplary embodiment.

According to the other exemplary embodiment, a coil component may include a magnetic body 110 including a plurality of filter parts 200 and 400 disposed on a substrate 111. The filter parts 200 and 400 are spaced apart from each other in a thickness direction. A plurality of input terminals 131 and 132 and output terminals 133 and 134 are disposed on outer surfaces of the magnetic body 110. The filter part 200 is composed of upper and lower coils 121 and 122 disposed in the magnetic body 110 and stacked relative to each other in the thickness direction (e.g., a direction orthogonal to a main surface of the substrate 111 on which the filter part 400 is disposed). The filter part 400 is composed of upper and lower coils 123 and 124 disposed in the magnetic body 110 and stacked relative to each other in the thickness direction. The number of turns of the coils 121 and 122 of one filter part 200 is the same as that of the coils 123 and 124 of another filter part 400 adjacent thereto. However, capacitance of one filter part 200 is different from that of another filter part 400 adjacent thereto.

The magnetic body 110 may include and enclose the substrate 111 and first and second filter parts 200 and 400. The plurality of filter parts 200 and 400 are disposed on the substrate 111 and spaced part from each other in the magnetic body 110 in the thickness direction.

Hereinafter, the coil component according to the exemplary embodiment of FIG. 4 will be described, but a description of the same features as those in the exemplary embodiment described above in relation to FIGS. 1-3 will be omitted in order to avoid an overlapping description.

The number of turns of the first and second coils 121 and 122 of the first filter part 200, which is one filter part, may be the same as the number of turns of the third and fourth coils 123 and 124 of the second filter part 400, which is another filter part adjacent thereto.

Since the number of turns of the first and second coils 121 and 122 of the first filter part 200 is the same as the number of turns of the third and fourth coils 123 and 124 of the second filter part 400 adjacent thereto, the first and second filter parts 200 and 400 may have the same (or substantially the same) inductance as each other.

Here, the first and second filter parts 200 and 400 have the same inductance or substantially the same inductance as each other, which may be understood as including components in which there is a little difference in inductance value between the first and second filter parts 200 and 400 due to process deviation as well as components in which inductance values of the first and second filter parts 200 and 400 are precisely equal to each other.

In the coil component according to other exemplary embodiment of FIG. 4, capacitance of the first filter part 200, which is one filter part, and capacitance of the second filter part 400, which is another filter part adjacent thereto, may be different from each other.

As described above, according to the exemplary embodiment described in relation to FIGS. 1-3, inductances and parasitic capacitances of respective filter parts may be different from each other by forming the coils constituting the first filter part 20 and the coils constituting the second filter part 40 to have different numbers of turns.

According to the other exemplary embodiment described in relation to FIG. 4, the first and second filter parts 200 and 400 may be adjusted to have the same (or substantially same) inductance as each other and to have different capacitances from each other by forming the coils of the first filter part 200 and the coils of the second filter part 400 to have the same number of turns but allowing respective coils to be differently disposed.

The first and second filter parts 200 and 400 may be adjusted to have different parasitic capacitances from each other as described above, and thus a resonance frequency of each of the filter parts may be adjusted and may be different from each other, and common mode noise in the plurality of frequency bands may be attenuated.

That is, in a case in which parasitic capacitance of the first filter part 200 is different from that of the second filter part 400, a frequency band in which the common mode noise is attenuated may be widened.

Hereinafter, various exemplary embodiments in which parasitic capacitance of the first filter part 200 is different from that of the second filter part 400 will be described.

Figure 5:
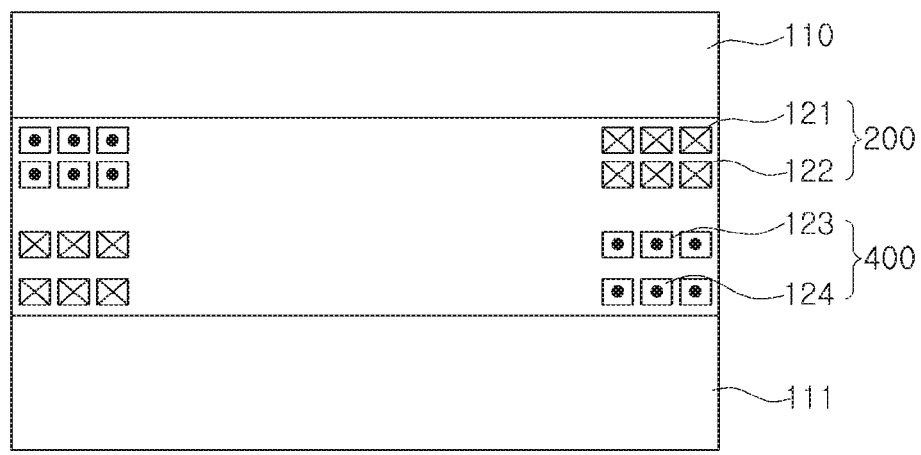
FIG. 5 is a cross-sectional view of a coil component according to a second exemplary embodiment, taken along line Y-Y' of FIG. 4.

FIG. 5 is a cross-sectional view of a coil component according to a second exemplary embodiment taken along line Y-Y' of FIG. 4.

Referring to FIG. 5, in the coil component according to the second exemplary embodiment, an interval or spacing between first and second coils 121 and 122 in the thickness direction (e.g., the direction in which the first and second coils 121 and 122 are stacked on each other) may be smaller than an interval or spacing between third and fourth coils 123 and 124 in the thickness direction.

In this embodiment, the first and second filter parts 200 and 400 may have different parasitic capacitances from each other that can be varied by adjusting the interval or spacing between the first and second coils 121 and 122 to be smaller than the interval between the third and fourth coils 123 and 124 as described above.

Therefore, resonance frequencies of the first and second filter parts 200 and 400 may be different from each other.

Figure 6:
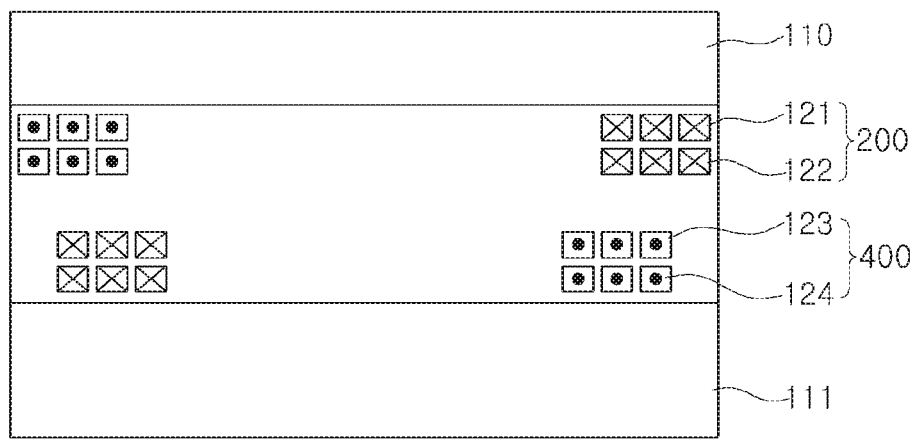
FIG. 6 is a cross-sectional view of a coil component according to a third exemplary embodiment, taken along line Y-Y' of FIG. 4.

FIG. 6 is a cross-sectional view of a coil component according to a third exemplary embodiment taken along line Y-Y' of FIG. 4.

Referring to FIG. 6, an internal cross-sectional area of first and second coils 121 and 122 may be larger than that of third and fourth coils 123 and 124. For example, in embodiments in which the coils are circular, the first and second coils 121 and 122 may have a larger diameter than that of third and fourth coils 123 and 124.

First and second filter parts 200 and 400 may have different parasitic capacitances from each other by adjusting the internal cross-sectional area of the first and second coils 121 and 122 to be larger than that of the third and fourth coils 123 and 124, for example as shown in FIG. 6.

Therefore, resonance frequencies of the first and second filter parts 200 and 400 may be different from each other.

Figure 7:
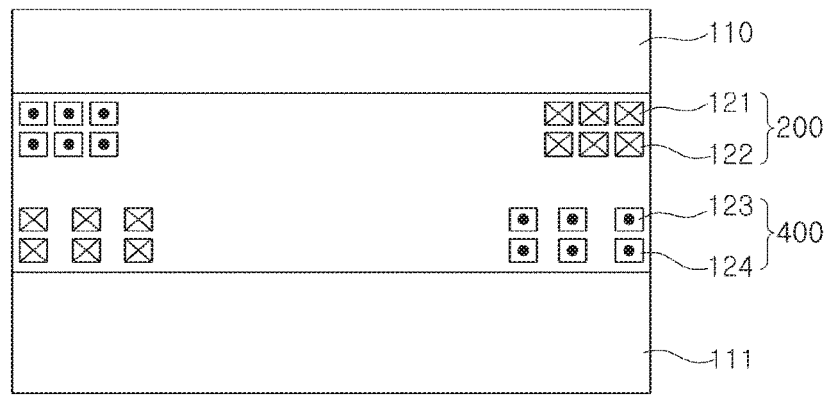
FIG. 7 is a cross-sectional view of a coil component according to a fourth exemplary embodiment, taken along line Y-Y' of FIG. 4.

FIG. 7 is a cross-sectional view of a coil component according to a fourth exemplary embodiment taken along line Y-Y' of FIG. 4.

Referring to FIG. 7, a distance between coil windings within each of the first and second coils 121 and 122 of a first filter part 200, which is one filter part, may be smaller than a distance between coil windings within each of the third and fourth coils 123 and 124 of a second filter part 400, which is another filter part.

As described above, the first and second filter parts 200 and 400 may have different parasitic capacitances from each other by adjusting the distance between the coil windings in each of the first and second coils 121 and 122 of the first filter part 200 to be smaller than the distance between the coil windings in each of the third and fourth coils 123 and 124 of the second filter part 400, as shown in FIG. 7.

Therefore, resonance frequencies of the first and second filter parts 200 and 400 may be different from each other.

According to another exemplary embodiment, when a direction of a current flowing in the coils 121 and 122 of the first filter part 200 and a direction of a current flowing in the coils 123 and 124 of the second filter part 400 are opposite to each other (e.g., direction of current flow is clockwise in the coils 121 and 122 and counterclockwise in the coils 123 and 124), directions of magnetic fluxes generated from the coils may become opposite to each other, and thus magnetic coupling may not be generated between two filters.

Even if there is no magnetic flux coupling prevention structure, the resonance frequencies may be separated from each other by adjusting the directions of the currents in the coils to be opposite to each other, and insertion loss characteristics and attenuation characteristics in two different frequency regions may be obtained.

The direction of the current flowing in the coils 121 and 122 of the first filter part 200 may be opposite to the direction of the current flowing in the coils 123 and 124 of the second filter part 400 by allowing a winding direction of the coils 121 and 122 of the first filter part 200 and a winding direction of the coils 123 and 124 of the second filter part 400 to be opposite to each other.

The following Table 1 illustrates unexpected results obtained by analyzing attenuation characteristics depending on a vertical distance (e.g., distance d) between the first and second filter parts in the coil component according to the exemplary embodiment shown and described herein.

TABLE 1

| Vertical Distance (μm) | First Filter Attenuation Amount (dB) | First Filter Resonance Frequency [GHz] | Second Filter Attenuation Amount (dB) | Second Filter Resonance Frequency [GHz] |
|---|---|---|---|---|
| 5 | −15 | 2.7 | −10 | 6.0 |
| 10 | −19 | 3.2 | −15 | 5.7 |
| 15 | −22 | 3.3 | −16 | 5.6 |
| 20 | −24 | 3.4 | −17 | 5.5 |
| 50 | −27 | 3.4 | −18 | 5.4 |
| 100 | −29.5 | 3.4 | −18.5 | 5.4 |
| 200 | −33 | 3.3 | −18 | 5.3 |
| 250 | −39.5 | 3.4 | −14 | 6.0 |

Referring to Table 1, in the coil component according to the exemplary embodiment, an attenuation amount may be increased and distortion of a resonance frequency to be attenuated may be decreased by adjusting a distance d between the first and second filter parts to be 10 μm to 200 μm.

The reason for which the attenuation amount is increased and distortion of the resonance frequency to be attenuated is decreased, as the distance between the first and second filter parts is increased, is that an offset effect between the magnetic fluxes generated in directions opposite to each other is decreased as the distance is increased.

Conversely, in a case in which the distance d between the first and second filter parts is 5 μm, which is less than 10 μm, the attenuation amount is decreased, and distortion of the resonance frequency to be attenuated is also increased as shown in the unexpected results reported in Table 1.

Further, in a case in which the distance d between the first and second filter parts is 250 μm, which is more than 200 μm, the attenuation amount of the second filter part is decreased, and distortion of the resonance frequency to be attenuated is also increased.

The reason is as follows. As the attenuation effect is lost due to an increase in the distance between the first and second filter parts, magnetic flux of the first filter part is excessively strong, and thus the attenuation amount of the first filter part may be increased. Additionally, the magnetic flux may have an influence on formation of the magnetic flux of the second filter part, thereby decreasing the attenuation amount and increasing distortion of the resonance frequency.

Figure 8:
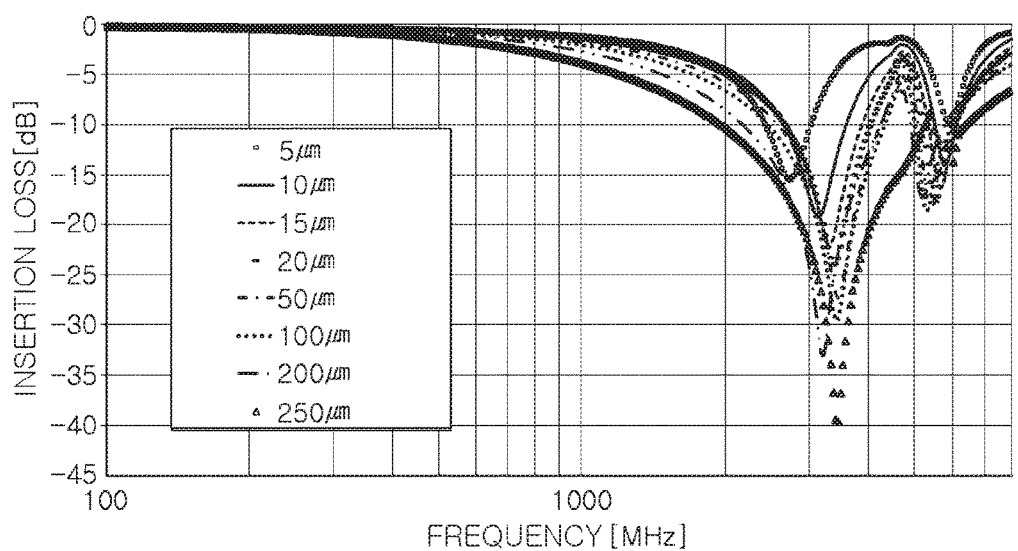
FIG. 8 is a graph illustrating attenuation characteristics depending on a vertical distance between filter parts in the coil component according to the exemplary embodiment.

FIG. 8 is a graph illustrating attenuation characteristics for different values of a vertical distance between filter parts in the coil component according to the exemplary embodiment.

Referring to Table 8, in the coil component according to the exemplary embodiment, it may be appreciated that an attenuation amount may be increased and distortion of a resonance frequency to be attenuated may be decreased by adjusting a distance d between first and second filter parts to be 10 μm to 200 μm.

As set forth above, in the coil components according to exemplary embodiments, inductances and capacitances of the two filter parts may be adjusted to as to be different from each other by allowing disposition conditions of the coils constituting the two filter parts to be different from each other. Thus, common mode noise attenuated in the frequency band may be widened, and the attenuation characteristics may be improved, for example by controlling the vertical distance between the filter parts.

While exemplary embodiments have been shown and described above, it will be apparent to those skilled in the art that modifications and variations could be made without departing from the scope of the present invention as defined by the appended claims.

What is claimed is:

1. A coil component comprising:
a body including a plurality of filter parts disposed on a substrate and spaced apart from each other in a thickness direction; and
a plurality of input terminals and output terminals disposed on outer surfaces of the body,
wherein:
each filter part of the plurality of filter parts includes upper and lower coils disposed in the body and spaced apart from each other in the thickness direction,
the upper coils of each filter part of the plurality of filter parts are connected in series such that a first current flowing in the series connected upper coil of one filter part of the plurality of filter parts produces a magnetic flux having a direction opposite to a magnetic flux produced by the first current flowing through the series connected upper coil of another filter part of the plurality of filter parts,
the lower coils of each of the filter parts of the plurality of filter parts are connected in series such that a second current flowing in the series connected lower coil of the one filter part produces a magnetic flux having a direction opposite to a magnetic flux produced by the second current flowing through the series connected lower coil of the other filter part, and
a distance between the upper and lower coils of the one filter part is smaller than a distance between the upper and lower coils of the other filter part.

2. The coil component of claim 1, wherein a distance between the one filter part and the other filter part is 10 μm to 200 μm.

3. The coil component of claim 1, wherein a number of turns of the upper and lower coils of the one filter part is different from a number of turns of the upper and lower coils of the other filter part.

4. A coil component comprising:
a body including a plurality of filter parts disposed on a substrate and spaced apart from each other in a thickness direction; and
a plurality of input terminals and output terminals disposed on outer surfaces of the body,
wherein:
each filter part of the plurality of filter parts includes upper and lower coils disposed in the body and spaced apart from each other in the thickness direction,
a number of turns of the upper and lower coils of one filter part of the plurality of filter parts is the same as a number of turns of the upper and lower coils of another filter part of the plurality of filter parts adjacent thereto, and
a distance between the coil windings in each of the upper and lower coils of the one filter part is smaller than a distance between the coil windings in each of the upper and lower coils of the other filter part.

5. A coil component comprising:
a body including a plurality of filter parts disposed on a substrate and spaced apart from each other in a thickness direction; and
a plurality of input terminals and output terminals disposed on outer surfaces of the body,
wherein:
each filter part of the plurality of filter parts includes upper and lower coils disposed in the body and spaced apart from each other in the thickness direction,
a number of turns of the upper and lower coils of one filter part of the plurality of filter parts is the same as a number of turns of the upper and lower coils of another filter part of the plurality of filter parts adjacent thereto, and
a distance between the upper and lower coils of the one filter part is smaller than a distance between the upper and lower coils of the other filter part.

6. The coil component of claim 5, wherein a capacitance of the one filter part is different from a capacitance of the other filter part adjacent thereto.

7. The coil component of claim 5, wherein an internal cross-sectional area of the upper and lower coils of the one filter part is larger than an internal cross-sectional area of the upper and lower coils of the other filter part.

8. The coil component of claim 5, wherein the upper and lower coils of the one filter part and of the other filter part are electrically connected such that a direction of a current flowing in the upper and lower coils of the one filter part is opposite to a direction of a current flowing in the upper and lower coils of the other coil part adjacent thereto.

9. A coil component comprising:
a body including first and second filter parts overlaying each other and a main surface of a substrate, and spaced apart from each other in a thickness direction orthogonal to the main surface of the substrate,
wherein:
each filter part of the first and second filter parts includes upper and lower coils disposed in the body to overlay each other and spaced apart from each other in the thickness direction,
one of the upper and lower coils of the first filter part is electrically connected in series with one of the upper and lower coils of the second filter part such that a first current flowing in the one coil of the first filter part produces a magnetic flux having a direction opposite to a magnetic flux produced by the first current flowing through the series connected one coil of the second filter part,
another of the upper and lower coils of the first filter part is electrically connected in series with another of the upper and lower coils of the second filter part such that a second current flowing in the other coil of the first filter part produces a magnetic flux having a direction opposite to a magnetic flux produced by the second current flowing through the series connected other coil of the second filter part, and
a distance between the coil windings in each of the upper and lower coils of the first filter part is smaller than a distance between the coil windings in each of the upper and lower coils of the second filter part.

10. The coil component of claim 9, further comprising:
a first via electrically connecting in series the one of the upper and lower coils of the first filter part with the one of the upper and lower coils of the second filter part; and
a second via electrically connecting in series the other of the upper and lower coils of the first filter part with the other of the upper and lower coils of the second filter part.

11. The coil component of claim 9, wherein a distance between the upper and lower coils of the first filter part is the same as a distance between the upper and lower coils of the second filter part.

12. The coil component of claim 9, wherein an internal cross-sectional area of the upper and lower coils of the first filter part is larger than an internal cross-sectional area of the upper and lower coils of the second filter part.

13. The coil component of claim 9, wherein the first filter part overlays the second filter part, and the lower coil of the first filter part is spaced apart from the upper coil of the second filter part by a distance of 10 μm to 200 μm.

14. The coil component of claim 13, wherein a number of turns of the upper and lower coils of the first filter part is different from a number of turns of the upper and lower coils of the second filter part.

15. The coil component of claim 9, wherein a distance between the upper and lower coils of the first filter part is smaller than a distance between the upper and lower coils of the second filter part.

16. The coil component of claim 15, wherein a number of turns of the upper and lower coils of the first filter part is the same as a number of turns of the upper and lower coils of the second filter part.

* * * * *